(12) United States Patent
Horita

(10) Patent No.: US 11,387,853 B2
(45) Date of Patent: Jul. 12, 2022

(54) RADIO FREQUENCY MODULE AND COMMUNICATION DEVICE

(71) Applicant: MURATA MANUFACTURING CO., LTD., Nagaokakyo (JP)

(72) Inventor: Atsushi Horita, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/087,764

(22) Filed: Nov. 3, 2020

(65) Prior Publication Data

US 2021/0152200 A1 May 20, 2021

(30) Foreign Application Priority Data

Nov. 15, 2019 (JP) .............................. JP2019-207291

(51) Int. Cl.
*H04B 1/04* (2006.01)
*H04B 1/10* (2006.01)
*H04B 1/16* (2006.01)
*H04B 1/12* (2006.01)

(52) U.S. Cl.
CPC ......... *H04B 1/0475* (2013.01); *H04B 1/1018* (2013.01); *H04B 1/12* (2013.01); *H04B 1/1607* (2013.01); *H04B 2001/0408* (2013.01)

(58) Field of Classification Search
CPC .. H04B 1/0475; H04B 1/1018; H04B 1/1607; H04B 1/12; H04B 2001/0408; H04B 1/0057; H04B 1/18; H04B 1/50; H04B 1/44; H04B 1/006; H04B 1/401; H04B 1/0458; H04B 2001/0416; H05K 1/02
See application file for complete search history.

(56) References Cited

U.S. PATENT DOCUMENTS

| 6,380,624 | B1 | 4/2002 | Hung | |
| 10,340,617 | B2* | 7/2019 | Liang | H02M 3/04 |
| 2006/0027841 | A1* | 2/2006 | Tamaki | H01L 25/0652 |
| | | | | 257/286 |
| 2007/0080757 | A1 | 4/2007 | Yahata et al. | |
| 2014/0346636 | A1* | 11/2014 | Miyagawa | H01L 24/97 |
| | | | | 257/531 |

(Continued)

FOREIGN PATENT DOCUMENTS

WO 2018/168500 A1 9/2018

OTHER PUBLICATIONS

Korean Office Action dated Dec. 7, 2021, in corresponding Korean Patent Application No. 10-2020-0149389, 9 pp.

*Primary Examiner* — Jean B Corrielus
(74) *Attorney, Agent, or Firm* — Xsensus LLP

(57) ABSTRACT

A radio frequency module includes: a module substrate; a first circuit component disposed on a first principal surface of the module substrate; and a second circuit component stacked on the first circuit component. Here, one of the first circuit component and the second circuit component includes a reception filter, the other of the first circuit component and the second circuit component includes a switch connected between an antenna connection terminal and the reception filter, and the second circuit component is connected to the first circuit component via a via electrode in the first circuit component or a side wiring on a side surface of the first circuit component.

20 Claims, 13 Drawing Sheets

(56) References Cited

U.S. PATENT DOCUMENTS

| | | | |
|---|---|---|---|
| 2015/0042417 A1* | 2/2015 | Onodera | H03H 9/6479 |
| | | | 333/195 |
| 2015/0364445 A1* | 12/2015 | Choi | H01L 23/66 |
| | | | 257/664 |
| 2016/0301382 A1* | 10/2016 | Iwamoto | H03H 9/0552 |
| 2017/0026071 A1 | 1/2017 | Young | |
| 2019/0014655 A1* | 1/2019 | Yazaki | H01F 17/0013 |
| 2019/0115309 A1 | 4/2019 | Modi et al. | |
| 2020/0204159 A1* | 6/2020 | Onodera | H03H 9/059 |

* cited by examiner

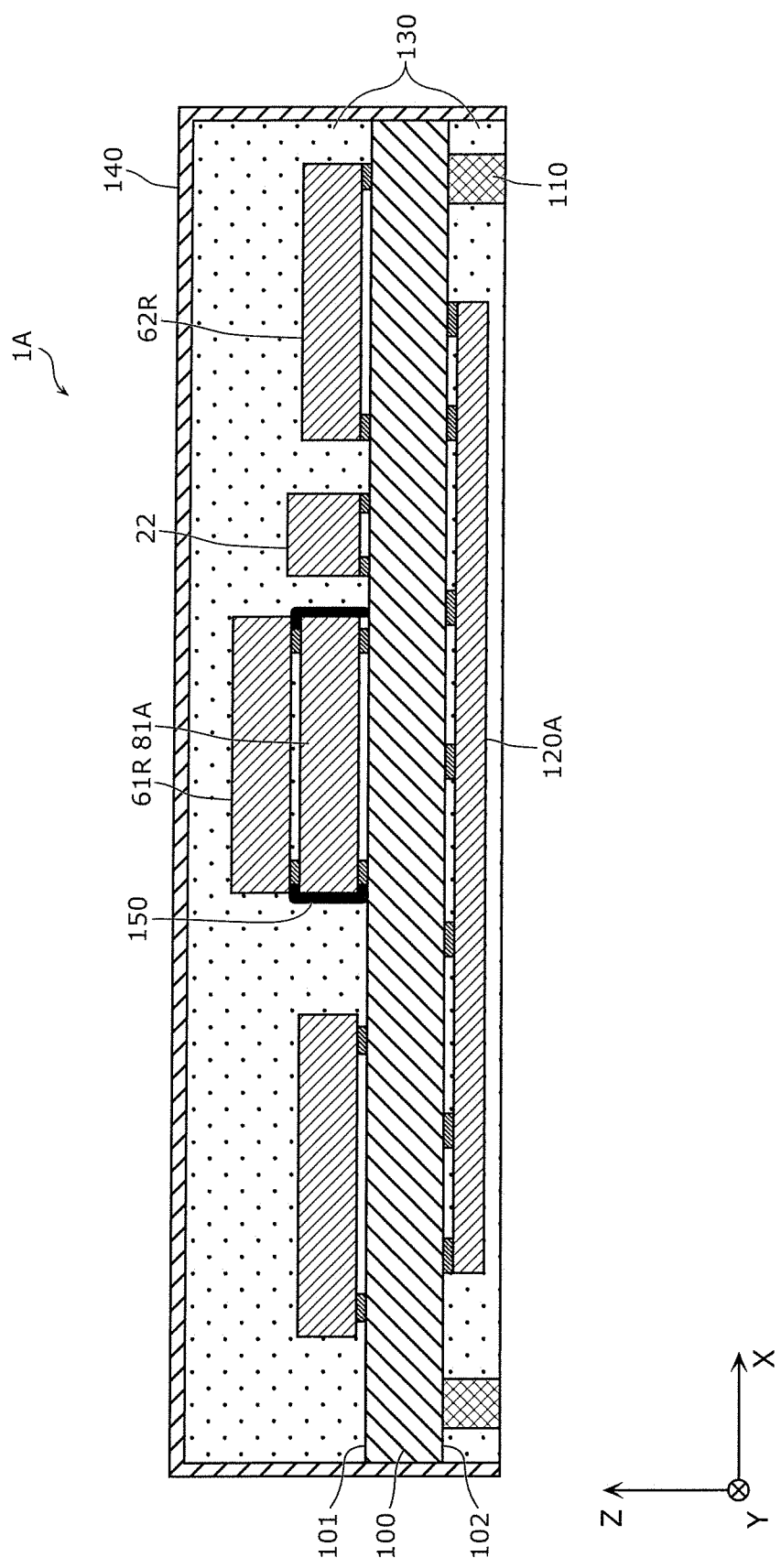

RADIO FREQUENCY MODULE AND COMMUNICATION DEVICE

CROSS REFERENCE TO RELATED APPLICATION

The present application is based on and claims priority of Japanese Patent Application No. 2019-207291 filed on Nov. 15, 2019. The entire disclosure of the above-identified application, including the specification, drawings and claims is incorporated herein by reference in its entirety.

TECHNICAL FIELD

The present disclosure relates to a radio frequency module and a communication device.

BACKGROUND

In a mobile communication device such as a mobile phone, the disposition and structure of circuit elements of a radio frequency front-end circuit are increasingly more complex with the progress particularly in multiband communications.

United States Patent Application Publication No. 2019/0115309 discloses a technique of achieving the downsizing of a radio frequency module by stacking an integrated circuit over an acoustic wave filter.

SUMMARY

Technical Problems

However, as recognized by the present inventor, the radio frequency module disclosed in United States Patent Application Publication No. 2019/0115309 has a long wiring between the integrated circuit stacked over the acoustic wave filter and another circuit. This causes wiring loss and wiring variation, resulting in an increase in mismatching loss.

In view of the above, the present disclosure aims to provide a radio frequency module and a communication device capable of reducing mismatching loss caused by wiring loss and wiring variation, thereby improving electrical characteristics.

Solutions

The radio frequency module according to an aspect of the present disclosure includes: a substrate including a first principal surface; a first circuit component disposed on the first principal surface; and a second circuit component stacked on the first circuit component. In this radio frequency module, one of the first circuit component and the second circuit component includes a first filter, the other of the first circuit component and the second circuit component includes a first switch connected between an antenna connection terminal and the first filter, and the second circuit component is connected to the first circuit component via a via electrode in the first circuit component or a side wiring on a side surface of the first circuit component.

Advantageous Effects

The present disclosure is capable of reducing mismatching loss caused by wiring loss and wiring variation, thereby improving electrical characteristics.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 6 is a cross-sectional view of the radio frequency module according to Embodiment 2.

DESCRIPTION OF EMBODIMENTS

Figure 1:
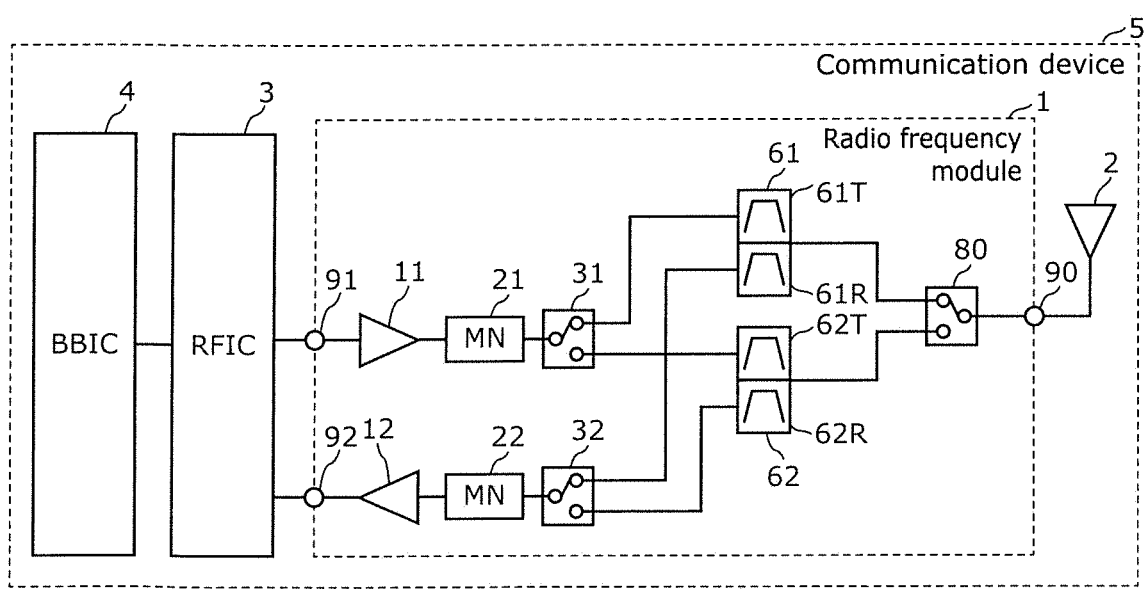
FIG. 1 is a diagram showing the circuit structures of a radio frequency module and a communication device according to Embodiment 1.

The following describes in detail the embodiments and variations thereof according to the present disclosure with reference to the drawings. Note that the following embodiments and variations thereof show a comprehensive or specific example of the present disclosure. The numerical values, shapes, materials, structural elements, the arrangement and connection of the structural elements, etc. shown in the following embodiments and variations thereof are mere examples, and thus are not intended to limit the present disclosure.

Note that the drawings are schematic diagrams in which emphasis, omission, or ratio adjustment has been applied where necessary to illustrate the present disclosure. The drawings are thus not necessarily exact illustration of the present disclosure, and may illustrate shapes, positional relationships, and ratios differently from the actual ones. In the drawings, substantially the same structural elements are assigned the same reference marks, and their repetitive description may be omitted or simplified.

In the drawings, the X axis and the Y axis are orthogonal to each other on a plane that is parallel to a principal surface of a module substrate. Also, the Z axis is normal to a principal surface of the module substrate. The positive direction and the negative direction of the Z axis indicate the upward direction and the downward direction, respectively.

Also, terms used in the present disclosure have the meanings described below.

"connected" means not only the case where elements are directly connected via a connection terminal and/or a wiring conductor, but also the case where elements are electrically connected via another circuit element.

terms that represent the relation between elements (e.g., "parallel" and "vertical"), terms that represent the shape of an element (e.g., "rectangular"), and a range of numerical values indicate not only the exact meanings of the terms, but also substantially equivalent scopes of the terms. For example, such terms include the meaning of a few percent of error.

"plan view" means a view of an object, from the Z direction, that is orthographically projected onto the XY plane.

"A overlaps B in a plan view of a substrate" means that the region of A in a plan view of the substrate overlaps the region of B in a plan view of the substrate.

Embodiment 1

Figure 2A:
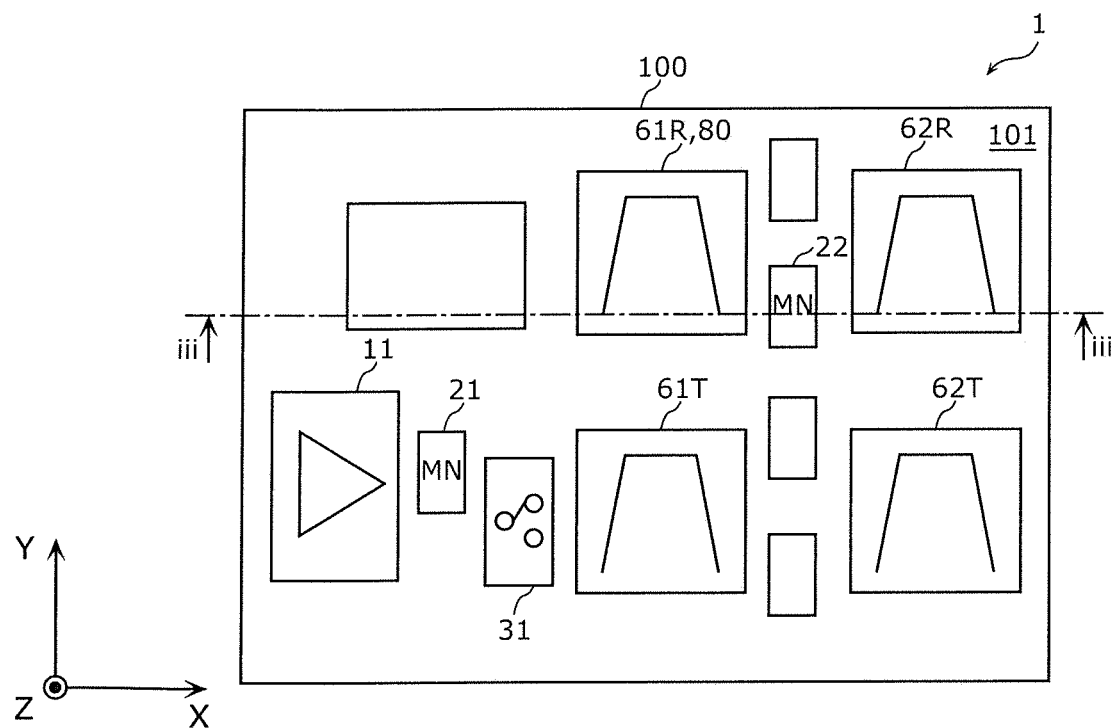
FIG. 2A is a plan view of the radio the frequency module according to Embodiment 1.
Figure 2B:
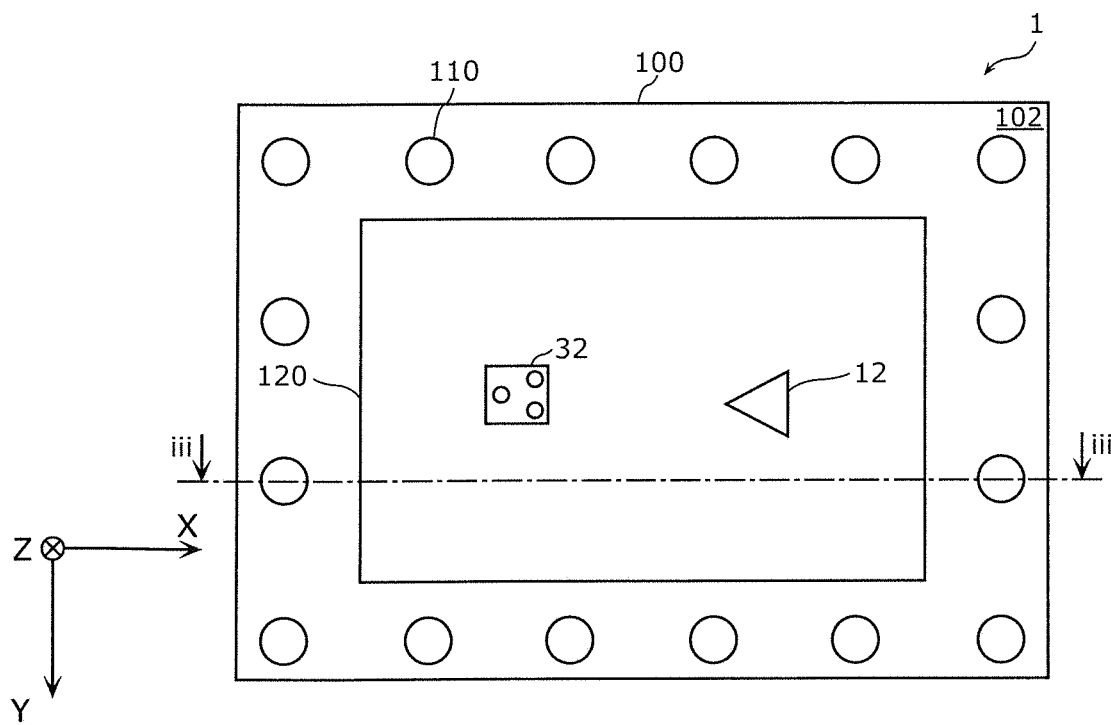
FIG. 2B is a bottom view of the radio frequency module according to Embodiment 1.
Figure 3:
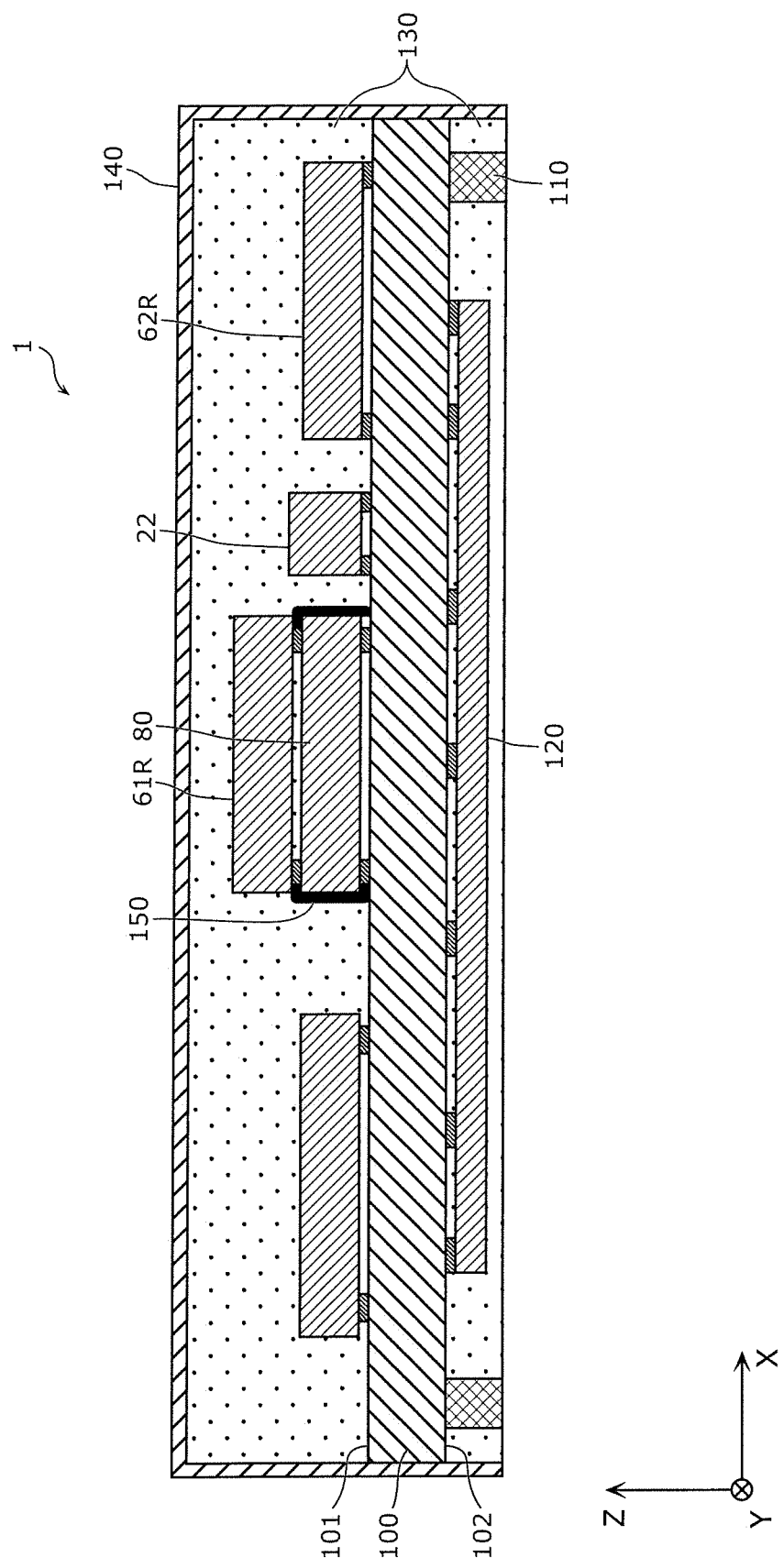
FIG. 3 is a cross-sectional view of the radio frequency module according to Embodiment 1.

With reference to FIG. 1 through FIG. 3, Embodiment 1 will be described below.

[1.1 Circuit Structures of Radio Frequency Module 1 and Communication Device 5]

The following describes the circuit structures of radio frequency module 1 and communication device 5 according to the present embodiment. FIG. 1 is a diagram showing the circuit structures of radio frequency module 1 and communication device 5 according to Embodiment 1.

[1.1.1 Circuit Structure of Communication Device 5]

With reference to FIG. 1, the circuit structure of communication device 5 will be specifically described. As shown in FIG. 1, communication device 5 includes radio frequency module 1, antenna 2, RFIC 3, and BBIC 4.

Radio frequency module 1 transfers a radio frequency signal between antenna 2 and RFIC 3. A detailed circuit structure of radio frequency module 1 will be described later.

Antenna 2 is connected to antenna connection terminal 90 of radio frequency module 1. Antenna 2 radiates a radio frequency signal outputted from radio frequency module 1. Antenna 2 also receives a radio frequency signal from outside and outputs the received radio frequency signal to radio frequency module 1.

RFIC 3 corresponds to the signal processing circuit that processes a radio frequency signal transmitted or received by antenna 2. More specifically, RFIC 3 performs signal processing, such as down-conversion, on a radio frequency reception signal inputted via a reception signal path of radio frequency module 1, and outputs the resulting reception signal to BBIC 4. RFIC 3 also performs signal processing, such as up-conversion, on a transmission signal inputted from BBIC 4, and outputs the resulting radio frequency transmission signal to a transmission signal path of radio frequency module 1.

BBIC 4 is a baseband signal processing circuit that performs signal processing by use of an intermediate frequency band, the frequency of which is lower than that of a radio frequency signal transferred by radio frequency module 1. The signal processed by BBIC 4 is used, for example, as an image signal for image display, or as a sound signal for telephone conversation through a speaker.

RFIC 3 controls connections of switches 31, 32, and 80 included in radio frequency module 1 on the basis of a communication band to be used. RFIC 3 also transfers, to radio frequency module 1, a control signal for adjusting the gain, etc. of power amplifier 11 of radio frequency module 1.

Note that communication device 5 according to the present embodiment may not include antenna 2 and BBIC 4. Stated differently, antenna 2 and BBIC 4 are not essential structural elements of the communication device according to the present disclosure.

[1.1.2 Circuit Structure of Radio Frequency Module 1]

With reference to FIG. 1, the circuit structure of radio frequency module 1 will be specifically described. As shown in FIG. 1, radio frequency module 1 includes power amplifier 11, low-noise amplifier 12, matching circuits 21 and 22, switches 31, 32, and 80, duplexers 61 and 62, antenna connection terminal 90, transmission input terminal 91, and reception output terminal 92.

Power amplifier 11 amplifies radio frequency transmission signals inputted from transmission input terminal 91. More specifically, power amplifier 11 amplifies radio frequency transmission signals in communication band A (first communication band) and communication band B (second communication band).

Low-noise amplifier 12 amplifies radio frequency reception signals and outputs the resulting signals to reception output terminal 92. More specifically, low-noise amplifier 12 performs low-noise amplification on radio frequency reception signals in communication band A and communication band B.

Duplexer 61 passes radio frequency signals in communication band A. Duplexer 61 transfers a transmission signal and a reception signal in communication band A by the Frequency Division Duplex (FDD) method. Duplexer 61 includes transmission filter 61T and reception filter 61R.

Transmission filter 61T is connected between power amplifier 11 and antenna connection terminal 90. Transmission filter 61T passes a transmission signal in the transmission frequencies of communication band A among transmission signals amplified by power amplifier 11.

Reception filter 61R, which is an example of the first filter, is connected between low-noise amplifier 12 and antenna connection terminal 90. Reception filter 61R passes a reception signal in the reception frequencies of communication band A among reception signals inputted from antenna connection terminal 90.

Duplexer 62 passes radio frequency signals in communication band B. Duplexer 62 transfers a transmission signal and a reception signal in communication band B by the FDD method. Duplexer 62 includes transmission filter 62T and reception filter 62R.

Transmission filter 62T is connected between power amplifier 11 and antenna connection terminal 90. Transmission filter 62T passes a transmission signal in the transmission frequencies of communication band B among transmission signals amplified by power amplifier 11.

Reception filter 62R, which is an example of the second filter, is connected between low-noise amplifier 12 and antenna connection terminal 90. Reception filter 62R passes a reception signal in the reception frequencies of communication band B among reception signals inputted from antenna connection terminal 90.

In the present embodiment, communication band A is on a lower frequency side than communication band B. Stated differently, duplexer 61 has a lower frequency passband than duplexer 62.

Matching circuit 21 is connected between power amplifier 11 and transmission filters 61T and 62T, and connected to the output terminal of power amplifier 11. Matching circuit 21 matches the impedance between power amplifier 11 and transmission filters 61T and 62T.

Matching circuit 22 is connected between low-noise amplifier 12 and reception filters 61R and 62R, and connected to the input terminal of low-noise amplifier 12.

Matching circuit 22 matches the impedance between low-noise amplifier 12 and reception filters 61R and 62R.

Switch 31 is connected between transmission filters 61T and 62T and power amplifier 11. More specifically, switch 31 includes a common terminal and two selection terminals. The common terminal of switch 31 is connected to power amplifier 11 via matching circuit 21. One of the selection terminals of switch 31 is connected to transmission filter 61T, and the other of the selection terminals of switch 31 is connected to transmission filter 62T. Having such connection structure, switch 31 switches a connection between the common terminal and one of the selection terminals, and a connection between the common terminal and the other of the selection terminals. Stated differently, switch 31 is a band selector switch that switches a connection between power amplifier 11 and transmission filter 61T, and a connection between power amplifier 11 and transmission filter 62T. Switch 31 is implemented, for example, as a single pole double throw (SPDT) switch circuit.

Switch 32, which is an example of the second switch, is connected between reception filters 61R and 62R and low-noise amplifier 12. More specifically, switch 32 includes a common terminal and two selection terminals. The common terminal of switch 32 is connected to low-noise amplifier 12 via matching circuit 22. One of the selection terminals of switch 32 is connected to reception filter 61R, and the other of the selection terminals of switch 32 is connected to reception filter 62R. Having such connection structure, switch 32 switches a connection between the common terminal and one of the selection terminals, and a connection between the common terminal and the other of the selection terminals. Stated differently, switch 32 is an IN switch that switches a connection between low-noise amplifier 12 and reception filter 61R, and a connection between low-noise amplifier 12 and reception filter 62R. Switch 32 is implemented, for example, as a SPDT switch circuit.

Switch 80, which is an example of the first switch, is connected between antenna connection terminal 90 and duplexers 61 and 62. More specifically, switch 80 includes a common terminal and two selection terminals. The common terminal of switch 80 is connected to antenna connection terminal 90. One of the selection terminals of switch 80 is connected to duplexer 61, and the other of the selection terminals of switch 80 is connected to duplexer 62. Having such connection structure, switch 80 switches a connection/disconnection between the common terminal and one of the selection terminals, and a connection/disconnection between the common terminal and the other of the selection terminals. Stated differently, switch 80 is an antenna switch that switches a connection/disconnection between antenna 2 and duplexer 61, and a connection/disconnection between antenna 2 and duplexer 62. Switch 80 is implemented, for example, as a multi-connection switch circuit.

Note that radio frequency module 1 may not include one or more of the circuit elements shown in FIG. 1. Radio frequency module 1 is simply required to include, for example, at least reception filter 61R and switch 80 without needing to include other circuit elements.

[1.2 Disposition of Circuit Components of Radio Frequency Module 1]

With reference to FIG. 2A, FIG. 2B, and FIG. 3, the following specifically describes the disposition of the circuit components of radio frequency module 1 with the above structure.

FIG. 2A is a plan view of radio frequency module 1 according to Embodiment 1. FIG. 2B is a bottom view of radio frequency module 1 according to Embodiment 1. FIG. 3 is a cross-sectional view of radio frequency module 1 according to Embodiment 1. FIG. 3 shows a cross-section of radio frequency module 1 cult along iii-iii line shown in FIG. 2A and FIG. 2B.

As shown in FIG. 2A, FIG. 2B, and FIG. 3, in addition to the circuit components that incorporate the circuit elements shown in FIG. 1, radio frequency module 1 further includes module substrate 100, a plurality of post electrodes 110, resin members 130, shield electrode layer 140, and other circuit components (without reference marks). Note that FIG. 2A and FIG. 2B omit the illustration of resin members 130 and shield electrode layer 140.

Module substrate 100 includes first principal surface 101 and second principal surface 102 opposing first principal surface 101. Non-limiting examples of module substrate 100 include a printed circuit board (PCB), a low temperature co-fired ceramics (LTCC) substrate, and a multilayered resin substrate.

First principal surface 101 is also referred to as an upper surface or a surface. As shown in FIG. 2A, mounted on first principal surface 101 are power amplifier 11, matching circuits 21 and 22, switches 31 and 80, transmission filters 61T and 62T, and reception filters 61R and 62R.

Second principal surface 102 is also referred to as a lower surface or a back surface. As shown in FIG. 2B, mounted on second principal surface 102 are low-noise amplifier 12 and switch 32.

Matching circuits 21 and 22 each include at least one inductor.

Matching circuits 21 and 22 are each mounted on first principal surface 101 as, for example, a surface mount device (SMD) or an integrated passive device (IPD). Note that matching circuits 21 and 22 may each include at least one capacitor, in addition to at least one inductor.

Switch 80 is disposed on first principal surface 101 as a switch component. The switch component as switch 80 is an example of the first circuit component. Non-limiting examples of the switch component to be used include a semiconductor integrated circuit (IC). The semiconductor IC has, for example, a complementary metal oxide semiconductor (CMOS) structure. More specifically, the semiconductor IC is fabricated by a silicon on insulator (SOI) process. Note that the semiconductor IC may include at least one of GaAs, SiGe, and GaN.

Note that the following description refers to switch 80 and the switch component collectively as switch 80 without distinction.

Reception filter 61R is stacked on switch 80 as a filter component. The filter component as reception filter 61R is an example of the second circuit component. Non-limiting examples of the filter component include an acoustic wave filter utilizing surface acoustic wave (SAW), an acoustic wave filter utilizing bulk acoustic wave (BAW), an LC resonant filter, and a dielectric filter, or may be any combination of these filters.

Note that the following description refers to reception filter 61R and the filter component collectively as reception filter 61R without distinction.

Reception filter 61R is connected to switch 80 via side wirings 150 on side surfaces of switch 80. Side wirings 150 may be on side surfaces of switch 80 in any methods, and may comprise any materials.

Reception filter 62R is disposed on first principal surface 101 as a filter component. The filter component as reception filter 62R is an example of the fourth circuit component. Non-limiting examples of the filter component include an acoustic wave filter utilizing SAW, an acoustic wave filter utilizing BAW, an LC resonant filter, and a dielectric filter, or may be any combination of these filters.

Note that the following description refers to reception filter 62R and the filter component collectively as reception filter 62R without distinction.

Low-noise amplifier 12 and switch 32 are incorporated in semiconductor IC 120 disposed on second principal surface 102. Semiconductor IC 120 is an example of the third circuit component. Semiconductor IC 120 has, for example, a CMOS structure. More specifically, semiconductor IC 120 is fabricated by a SOI process. This enables a low-cost manufacture of semiconductor IC 120. Note that semiconductor IC 120 may include at least one of GaAs, SiGe, and GaN. This enables the output of a radio frequency signal having high quality amplification properties and noise characteristics.

In a plan view of module substrate 100, at least part of semiconductor IC 120 overlaps at least part of reception filter 61R.

A plurality of post electrodes 110 are an example of the external-connection terminals. Each of post electrodes 110 is disposed on and extends vertically from second principal surface 102 of module substrate 100. Also, each of post electrodes 110 penetrates resin member 130, and one of its ends is exposed from resin member 130. The ends of post electrodes 110 being exposed from resin member 130 are connected to an input and output terminal and/or a ground electrode, and so forth on the mother board that is disposed in the negative direction of the Z axis of radio frequency module 1.

Resin members 130 are disposed on first principal surface 101 and second principal surface 102 of module substrate 100, and cover the circuit components on first principal surfaces 101 and second principal surface 102. Resin members 130 are capable of ensuring the reliability of the circuit components disposed on first principal surfaces 101 and second principal surface 102, such as their mechanical strength and humidity resistance.

Shield electrode layer 140 covers the upper and side surfaces of resin members 130, and set at the ground potential. Shield electrode layer 140 is capable of preventing the entry of exogenous noise into the circuit components included in radio frequency module 1.

Note that radio frequency module 1 may not include resin members 130 and shield electrode layer 140. Stated differently, resin members 130 and shield electrode layer 140 are not essential structural elements of the radio frequency module according to the present disclosure.

[1.3 Effects, Etc.]

As described above, radio frequency module 1 according to the present embodiment includes: module substrate 100; a first circuit component disposed on first principal surface 101 of module substrate 100; and a second circuit component stacked on the first circuit component. The first circuit component includes switch 80 connected between antenna connection terminal 90 and reception filter 61R. The second circuit component is connected to the first circuit component via side wirings 150 on side surfaces of the first circuit component.

Also, communication device 5 according to the present embodiment includes: RFIC 3 that processes a radio frequency signal transmitted or received by antenna 2; and radio frequency module 1 that transfers the radio frequency signal between antenna 2 and RFIC 3.

This structure, in which reception filter 61R is stacked on switch 80, achieves the downsizing of radio frequency module 1. Furthermore, this structure, in which switch 80 and reception filter 61R are connected via side wirings 150, reduces the wiring length between switch 80 and reception filter 61R. Consequently, mismatching loss caused by wiring loss and wiring variation is reduced, thereby improving the electrical characteristics (e.g., noise figure (NF), gain characteristics) of radio frequency module 1. In particular, this structure reduces wiring loss, etc. at an upstream of the reception path, thus preventing noise from dispersing into a downstream of the reception path. Consequently, the electrical characteristics of the reception path of radio frequency module 1 are effectively improved.

Radio frequency module 1 according to the present embodiment may include, for example, a third circuit component (semiconductor IC 120) that is disposed on second principal surface 102 opposing first principal surface 101 of module substrate 100. Such third circuit component may include low-noise amplifier 12 that amplifies a radio frequency reception signal.

This structure, in which circuit components are mounted on both sides of module substrate 100, achieves a further downsizing of radio frequency module 1.

Also, in radio frequency module 1 according to the present embodiment, in a plan view of module substrate 100, at least part of the second circuit component (reception filter 61R) may overlap at least part of the third circuit component (semiconductor IC 120).

This structure, in which reception filter 61R and low-noise amplifier 12 are disposed closer to each other, reduces the wiring length in the reception path. Consequently, mismatching loss caused by wiring loss and wiring variation is reduced, thereby further improving the electrical characteristics of radio frequency module 1.

Also, radio frequency module 1 according to the present embodiment may include, for example, a fourth circuit component disposed on first principal surface 101 of module substrate 100. Such fourth circuit component may include reception filter 62R, and switch 80 may be connected between antenna connection terminal 90 and reception filters 61R and 62R.

This structure has two reception filters 61R and 62R connected to switch 80 that correspond to two communication bands A and B. This structure thus reduces the wiring length between two reception filters 61R and 62R in a state in which both of these reception filters 61R and 62R are connected to antenna connection terminal 90 to utilize carrier aggregation (CA). This structure thus reduces matching error at the time of using CA, thus improving the electrical characteristics of radio frequency module 1 at the time of using CA.

Also, in radio frequency module 1 according to the present embodiment, reception filter 61R may include for example, a lower frequency passband than reception filter 62R.

In this structure, reception filter 61R at a lower frequency side is stacked on switch 80. This structure thus reduces the wiring length between switch 80 and reception filter 61R at the lower frequency side, the electrical characteristics of which are more affected by the wiring length. This consequently improves the electrical characteristics of radio frequency module 1 at the time of using CA.

Embodiment 2

Figure 4:
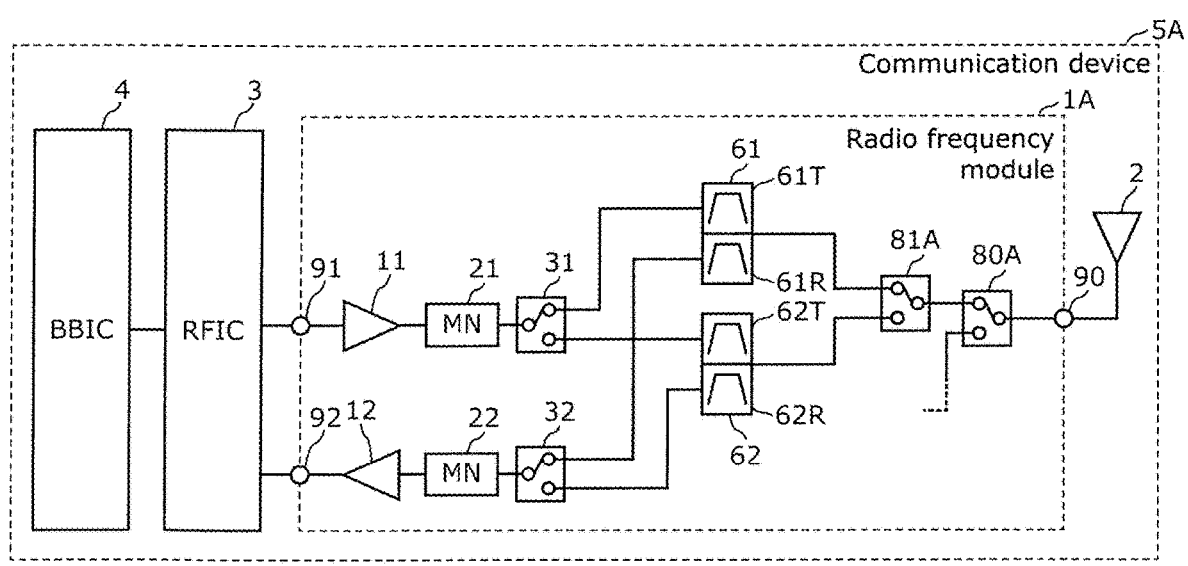
FIG. 4 is a diagram showing the circuit structures of a radio frequency module and a communication device according to Embodiment 2.

With reference to FIG. 4 through FIG. 6, the following describes Embodiment 2. The present embodiment is different from Embodiment 1 mainly in that switch 80 according to Embodiment 1 is divided into two switches to enable a greater number of filters to be connected to antenna 2. The following description focuses on the difference from Embodiment 1 to describe radio frequency module 1A and communication device 5A according to the present embodiment.

[2.1 Circuit Structures of Radio Frequency Module 1A and Communication Device 5A]

The following describes the circuit structures of radio frequency module 1A and communication device 5A according to the present embodiment. FIG. 4 is a diagram showing the circuit structures of radio frequency module 1A and communication device 5A according to Embodiment 2.

As shown in FIG. 4, communication device 5A includes radio frequency module 1A, antenna 2, RFIC 3, and BBIC 4. Radio frequency module 1A includes power amplifier 11, low-noise amplifier 12, matching circuits 21 and 22, switches 31, 32, 80A, and 81A, duplexers 61 and 62, antenna connection terminal 90, transmission input terminal 91, and reception output terminal 92.

Switch 80A, which is an example of the third switch, is connected between antenna connection terminal 90 and switch 81A. More specifically, switch 80A includes a common terminal and two selection terminals. The common terminal of switch 80A is connected to antenna connection terminal 90. One of the selection terminals of switch 80A is connected to the common terminal of switch 81A, and the other of the selection terminals of switch 80A is connected to another circuit element (not illustrated). Having such connection structure, switch 80A switches a connection/disconnection between the common terminal and one of the selection terminals, and a connection/disconnection between the common terminal and the other of the selection terminals. Stated differently, switch 80A is an antenna switch that switches a connection/disconnection between antenna connection terminal 90 and switch 81A, and a connection/disconnection between antenna connection terminal 90 and another circuit element. Switch 80A is implemented, for example, as a multi-connection switch circuit.

Switch 81A, which is an example of the first switch, is connected between antenna connection terminal 90 and duplexers 61 and 62. More specifically, switch 81A includes a common terminal and two selection terminals. The common terminal of switch 81A is connectable to antenna connection terminal 90 via switch 80A. One of the selection terminals of switch 81A is connected to duplexer 61, and the other of the selection terminals of switch 81A is connected to duplexer 62. Having such connection structure, switch 81A switches a connection/disconnection between the common terminal and one of the selection terminals, and a connection/disconnection between the common terminal and the other of the selection terminals. Stated differently, switch 81A switches a connection/disconnection between switch 80A and duplexer 61, and a connection/disconnection between switch 80A and duplexer 62. Switch 81A is implemented, for example, as a multi-connection switch circuit.

[2.2 Disposition of Circuit Components of Radio Frequency Module 1A]

Figure 5A:
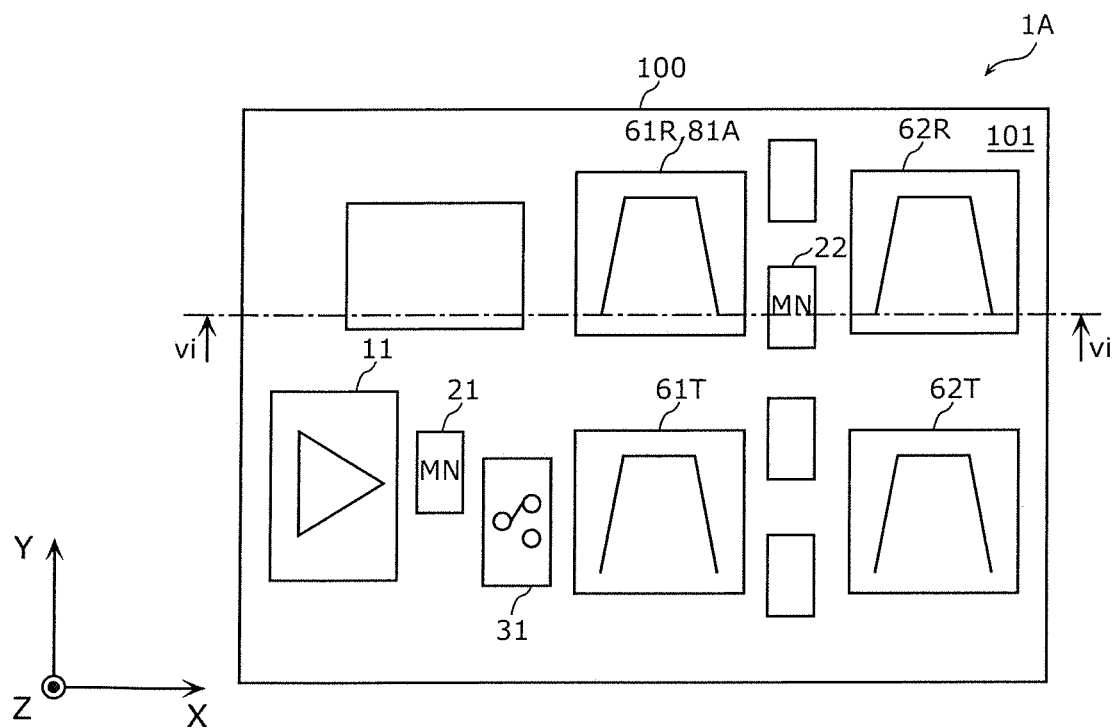
FIG. 5A is a plan view of the radio frequency module according to Embodiment 2.
Figure 5B:
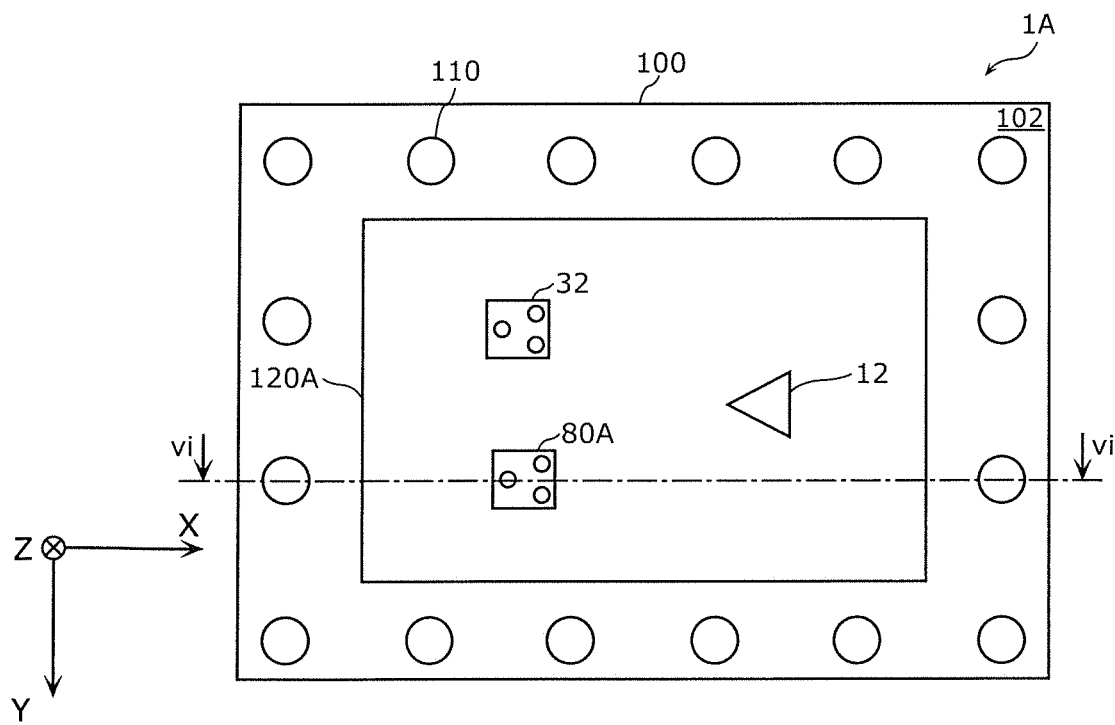
FIG. 5B is a bottom view of the radio frequency module according to Embodiment 2.

With reference to FIG. 5A, FIG. 5B, and FIG. 6, the following specifically describes the disposition of circuit components of radio frequency module 1A with the above structure.

FIG. 5A is a plan view of radio frequency module 1A according to Embodiment 2. FIG. 5B is a bottom view of radio frequency module 1A according to Embodiment 2. FIG. 6 is a cross-sectional view of radio frequency module 1A according to Embodiment 2. FIG. 6 shows a cross-section of radio frequency module 1A cult along vi-vi line shown in FIG. 5A and FIG. 5B.

Switch 81A is disposed on first principal surface 101 as a switch component. The switch component as switch 81A is an example of the first circuit component. Non-limiting examples of the switch component to be used include a semiconductor IC. The semiconductor IC has, for example, a CMOS structure. More specifically, the semiconductor IC is fabricated by a SOI process. Note that the semiconductor IC may include at least one of GaAs, SiGe, and GaN.

Switch 80A is incorporated in semiconductor IC 120A, together with low-noise amplifier 12 and switch 32, disposed on second principal surface 102. Semiconductor IC 120A is an example of the third circuit component. As with semiconductor IC 120 according to Embodiment 1, semiconductor IC 120A has, for example, a CMOS structure. More specifically, semiconductor IC 120A is fabricated by a SOI process. Note that semiconductor IC 120A may include at least one of GaAs, SiGe, and GaN.

In a plan view of module substrate 100, at least part of semiconductor IC 120A overlaps at least part of reception filter 61R.

[2.3 Effect, Etc.]

As described above, radio frequency module 1A according to the present embodiment includes: module substrate 100; a first circuit component disposed on first principal surface 101 of module substrate 100; a second circuit component stacked on the first circuit component; a third circuit component disposed on second principal surface 102 opposing first principal surface 101 of module substrate 100; and a fourth circuit component disposed on first principal surface 101 of module substrate 100. The first circuit component includes switch 81A connected between antenna connection terminal 90 and reception filters 61R and 62R. The second circuit component includes reception filter 61R, and is connected to the first circuit component via side wirings 150 on side surfaces of the first circuit component. The third circuit component includes: low-noise amplifier 12 that amplifies a radio frequency reception signal; and switch 80A connected between antenna connection terminal 90 and switch 81A. The fourth circuit component includes reception filter 62R.

In this structure, reception filter 61R and switch 81A, which is connected between switch 80A and reception filters 61R and 62R, are stacked. This structure thus reduces the wiring length between reception filter 61R and switch 81A, while enabling a reception filter and/or a transmission filter, etc. for another communication band to be connected to antenna connection terminal 90. Consequently, a higher degree of flexibility is achieved in the circuit structure of radio frequency module 1A, while improving the electrical characteristics of radio frequency module 1A.

Next, a plurality of variations of the above embodiments will be described. The following describes variations of Embodiment 1, but these variations are basically applicable also to Embodiment 2.

Variation 1

Figure 7:
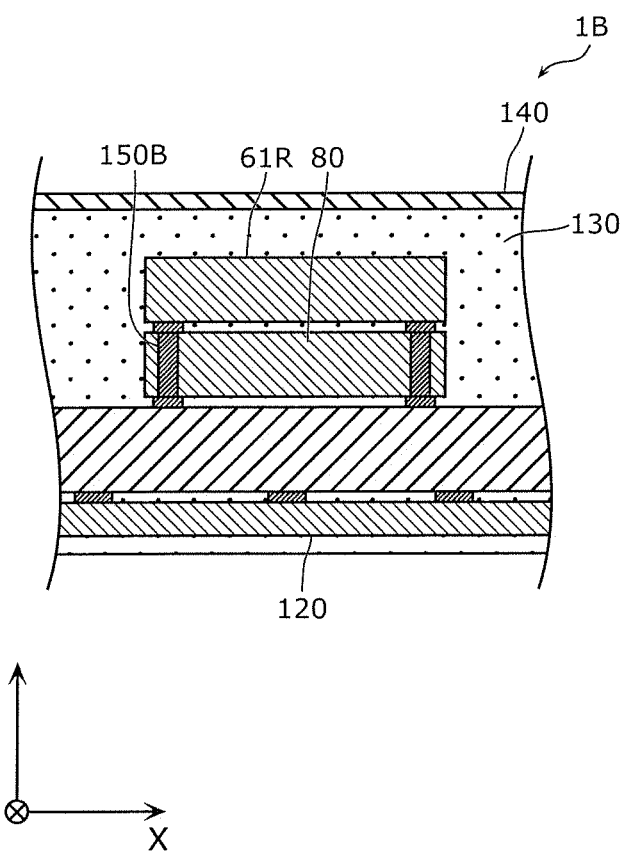
FIG. 7 is a partial cross-sectional view of a radio frequency module according to Variation 1.

With reference to FIG. 7, Variation 1 will be described. The present variation is different from Embodiment 1 mainly in that reception filter 61R is connected to switch 80 via via electrodes 150B instead of side wirings 150. The following description focuses on the difference from Embodiment 1 to describe radio frequency module 1B according to the present variation.

FIG. 7 is a partial cross-sectional view of radio frequency module 1B according to Variation 1. In the present variation, as shown in FIG. 7, via electrodes 150B are in switch 80.

Reception filter 61R stacked on switch 80 is connected to switch 80 via via electrodes 150B.

Via electrodes 150B, an example of which is through silicon vias (TSVs), connect the electrodes of reception filter 61R on the lower surface of the filter component and the electrodes of switch 80 on the lower surface of the switch component. Note that via electrodes 150B are not limited to through vias. For example, via electrodes 150B may be non-through vias on the upper surface of the switch component. In this case, via electrodes 150B may be connected to a wiring trace inside of the switch component. Via electrodes 150B may also be implemented as a combination of two non-through vias on the upper and lower surfaces of the switch component and a wiring trace that connects these two non-through vias inside of the switch component.

As described above, radio frequency module 1B according to the present variation includes: module substrate 100; a first circuit component disposed on first principal surface 101 of module substrate 100; and a second circuit component stacked on the first circuit component. The first circuit component includes switch 80 connected between antenna connection terminal 90 and reception filter 61R. The second circuit component includes reception filter 61 and is connected to the first circuit component via via electrodes 150B in the first circuit component.

As with Embodiment 1, this structure, in which switch 80 and reception filter 61R are connected via via electrodes 150B, reduces the wiring length between switch 80 and reception filter 61R. Consequently, mismatching loss caused by wiring loss and wiring variation is reduced, thereby improving the electrical characteristics of radio frequency module 1B.

Variation 2

Figure 8:
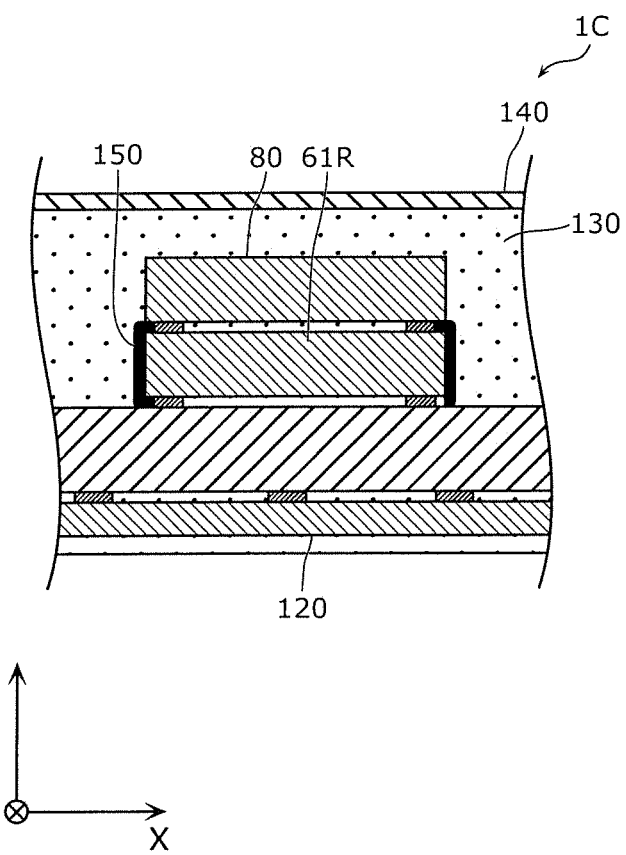
FIG. 8 is a partial cross-sectional view of a radio frequency module according to Variation 2.

With reference to FIG. 8, Variation 2 will be described. The present variation is different from Embodiment 1 mainly in that the positions of switch 80 and reception filter 61R are vertically reversed. The following description focuses on the difference from Embodiment 1 to describe radio frequency module 1C according to the present variation.

FIG. 8 is a partial cross-sectional view of radio frequency module 1C according to Variation 2. In the present variation, as shown in FIG. 8, reception filter 61R is included in the first circuit component disposed on first principal surface 101 of module substrate 100, and switch 80 is included in the second circuit component stacked on the first circuit component. Switch 80 is connected to reception filter 61R via side wirings 150 on side surfaces of reception filter 61R.

As described above, radio frequency module 1C according to the present variation includes: module substrate 100; a first circuit component disposed on first principal surface 101 of module substrate 100; and a second circuit component stacked on the first circuit component. The first circuit component includes reception filter 61R. The second circuit component includes switch 80 connected between antenna connection terminal 90 and reception filter 61R and is connected to the first circuit component via side wirings 150 on side surfaces of the first circuit component.

As with Embodiment 1, this structure, in which switch 80 is stacked on reception filter 61R, achieves the downsizing of radio frequency module 1C and improves the electrical characteristics thereof.

Variation 3

Figure 9:
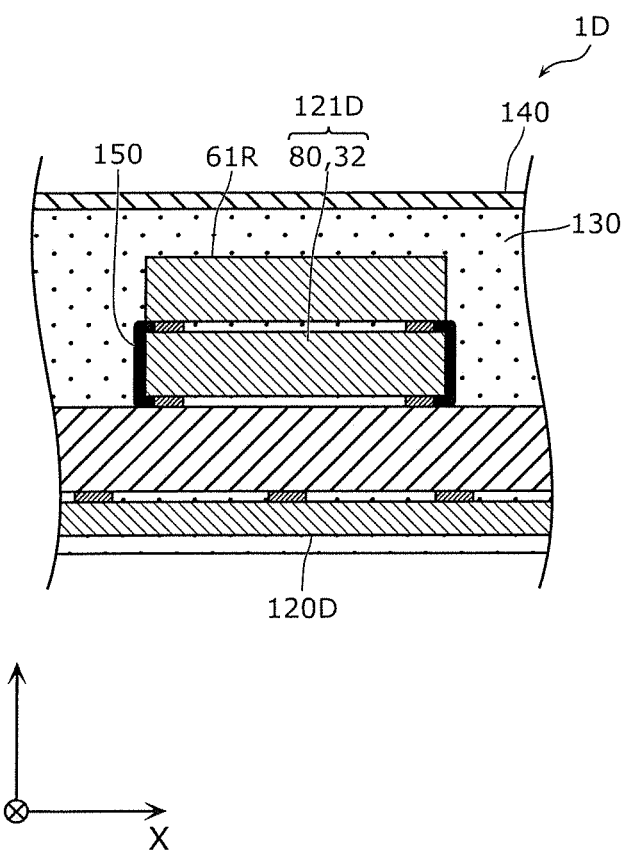
FIG. 9 is a partial cross-sectional view of a radio frequency module according to Variation 3.

With reference to FIG. 9, Variation 3 will be described. The present variation is different from Embodiment 1 mainly in that the first circuit component under the stacked component includes, in addition to switch 80, switch 32 that is connected between reception filter 61R and low-noise amplifier 12. The following description focuses on the difference from Embodiment 1 to describe radio frequency module 1D according to the present variation.

FIG. 9 is a partial cross-sectional view of radio frequency module 1D according to Variation 3. In the present variation, as shown in FIG. 9, switch 32 connected between reception filter 61R and low-noise amplifier 12 is included in semiconductor IC 121D, together with switch 80. Stated differently, switch 32 is not included in semiconductor IC 120D that is disposed on second principal surface 102 of module substrate 100. Here, semiconductor IC 121D corresponds to the first circuit component, and semiconductor IC 120D corresponds to the third circuit component.

As described above, radio frequency module 1D according to the present variation includes: module substrate 100; a first circuit component disposed on first principal surface 101 of module substrate 100; a second circuit component stacked on the first circuit component; and a third circuit component disposed on second principal surface 102 opposing first principal surface 101 of module substrate 100. The first circuit component includes switch 80 connected between antenna connection terminal 90 and reception filter 61R and switch 32 connected between reception filter 61R and low-noise amplifier 12. The second circuit component includes reception filter 61R, and is connected to the first circuit component via side wirings 150 on side surfaces of the first circuit component. The third circuit component includes low-noise amplifier 12.

This structure, in which switch 32 connected between reception filter 61R and low-noise amplifier 12 is incorporated in the first circuit component in addition to switch 80 connected between antenna connection terminal 90 and reception filter 61R, achieves a further downsizing of radio frequency module 1D. This structure also reduces the wiring length between reception filter 61R and switch 32, and further improves the electrical characteristics of radio frequency module 1D.

Variation 4

Figure 10:
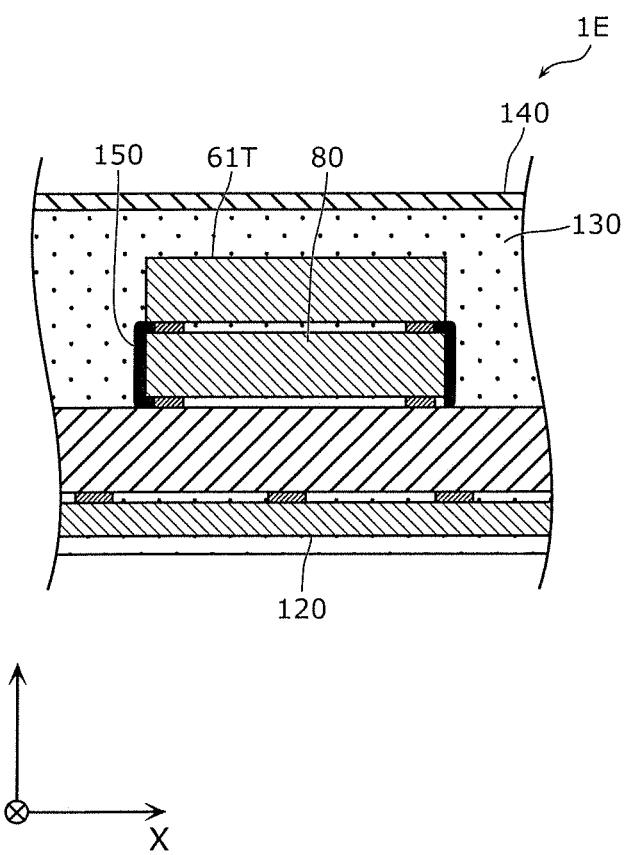
FIG. 10 is a partial cross-sectional view of a radio frequency module according to Variation 4.

With reference to FIG. 10, Variation 4 will be described. The present variation is different from Embodiment 1 mainly in that the second circuit component above the stacked component includes transmission filter 61T, instead of reception filter 61R. The following description focuses on the difference from Embodiment 1 to describe radio frequency module 1E according to the present variation.

FIG. 10 is a partial cross-sectional view of radio frequency module 1E according to Variation 4. In the present variation, as shown in in FIG. 10, transmission filter 61T is an example of the first filter, and is stacked on switch 80 as a filter component. The filter component as transmission filter 61T is an example of the second circuit component. Non-limiting examples of the filter component include an acoustic wave filter utilizing SAW, an acoustic wave filter utilizing BAW, an LC resonant filter, and a dielectric filter, or may be any combination of these filters.

As described above, radio frequency module 1E according to the present variation includes: module substrate 100; a first circuit component disposed on first principal surface 101 of module substrate 100; and a second circuit component stacked on the first circuit component. The first circuit component includes switch 80 connected between antenna connection terminal 90 and transmission filter 61T. The second circuit component includes transmission filter 61T and is connected to the first circuit component via side wirings 150 on side surfaces of the first circuit component.

This structure, in which transmission filter 61T is stacked on switch 80 instead of reception filter 61R, reduces the wiring length between switch 80 and transmission filter 61T. This consequently reduces wiring loss in the transmission circuit, while preventing a reception signal from being interfered by a transmission signal that flows between switch 80 and transmission filter 61T. The electrical characteristics of radio frequency module 1E are thus improved.

Variation 5

Figure 11:
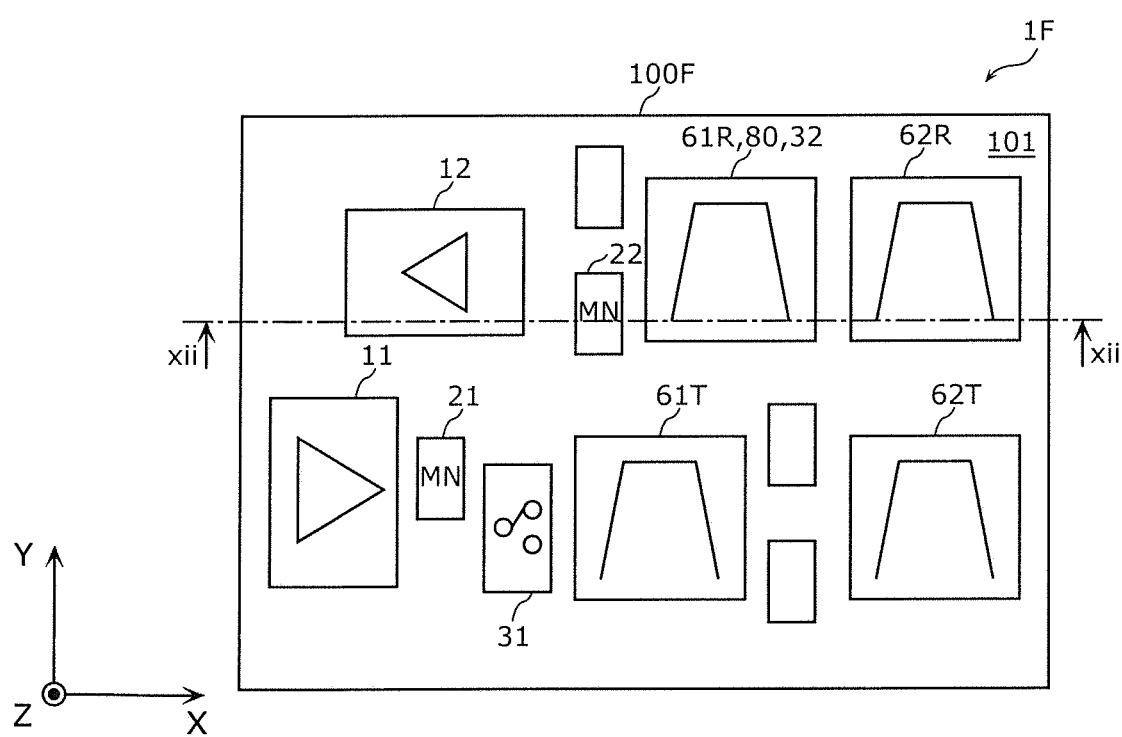
FIG. 11 is a plan view of a radio frequency module according to Variation 5.
Figure 12:
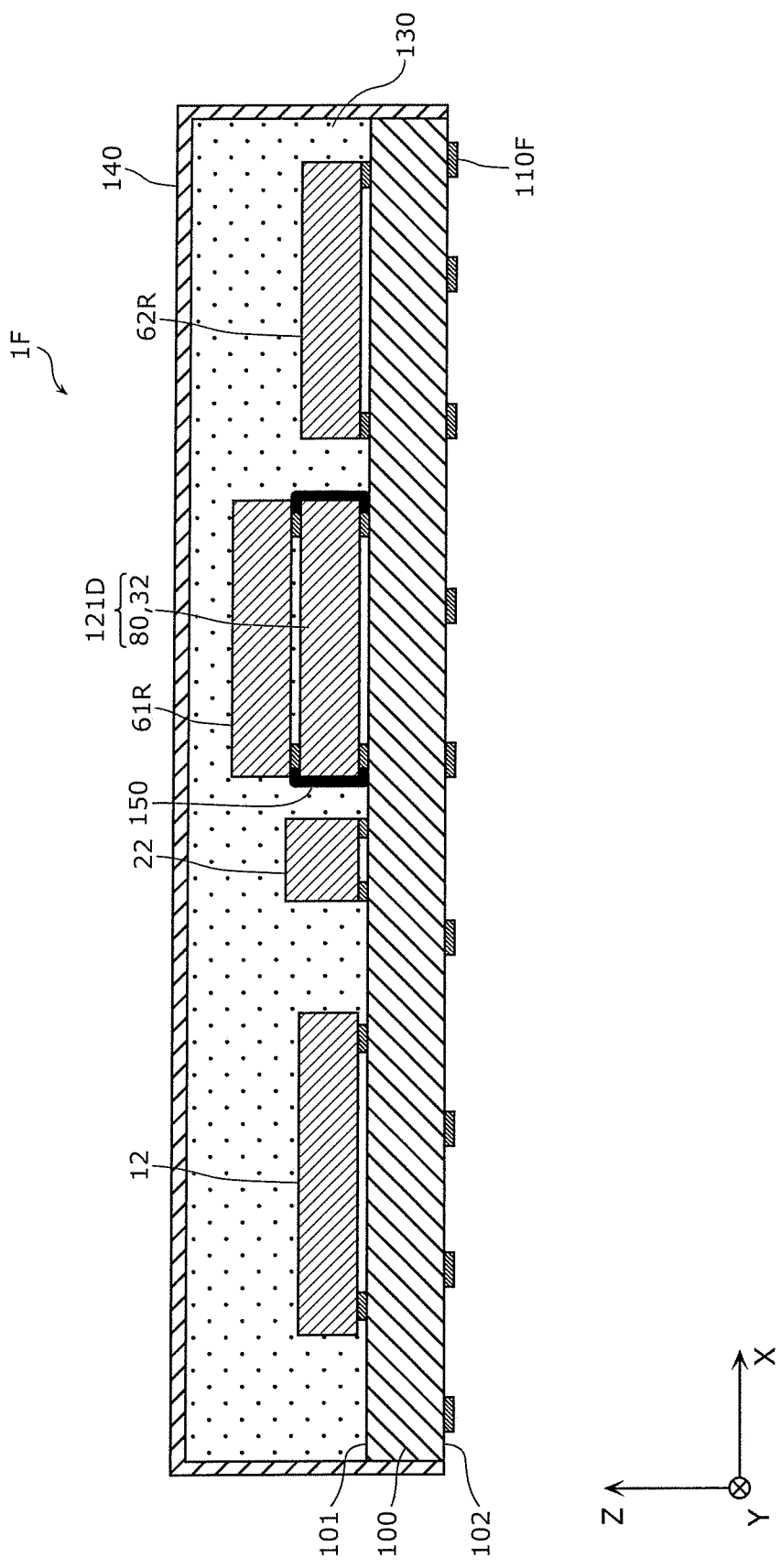
FIG. 12 is a cross-sectional view of the radio frequency module according to Variation 5.

With reference to FIG. 11 and FIG. 12, Variation 5 will be described. The present variation is different from Embodiment 1 mainly in that the circuit components are disposed on first principal surface 101 of module substrate 100, with no circuit components disposed on second principal surface 102. The following description focuses on the difference from Embodiment 1 to describe radio frequency module 1F according to the present variation.

FIG. 11 is a plan view of radio frequency module 1F according to Variation 5. FIG. 12 is a cross-sectional view of radio frequency module 1F according to Variation 5. FIG. 12 shows a cross-section of radio frequency module 1F cult along xii-xii line shown in FIG. 11.

In the present variation, as shown in FIG. 11, low-noise amplifier 12 is disposed on first principal surface 101 as an amplifier component. The amplifier component as low-noise amplifier 12 is an example of the third circuit component. Non-limiting examples of the amplifier component to be used include a semiconductor integrated circuit (IC). The semiconductor IC has, for example, a CMOS structure. More specifically, the semiconductor IC is fabricated by a SOI process. Note that the semiconductor IC may include at least one of GaAs, SiGe, and GaN.

Note that the following description refers to low-noise amplifier 12 and the amplifier component collectively as low-noise amplifier 12 without distinction.

As with Variation 3, switch 32 according to the present variation is included in semiconductor IC 121D together with switch 80.

In a plan view of module substrate 100, low-noise amplifier 12, matching circuit 22, and semiconductor IC 121D are disposed side-by-side. This disposition reduces the distance between low-noise amplifier 12 and matching circuit 22, and the distance between matching circuit 22 and semiconductor IC 121D. This thus achieves a shorter wiring length in the reception circuit. Consequently, mismatching loss caused by wiring loss and wiring variation is reduced, thus improving the reception sensitivity.

A plurality of bump electrodes 110F are disposed on second principal surface 102 of module substrate 100, instead of a plurality of post electrodes 110. A plurality of bump electrodes 110F, which is an example of the external-connection terminals, are connected to an input and output terminal and/or a ground electrode, and so forth on the mother board that is disposed in the negative direction of the Z axis of radio frequency module 1F.

As described above, radio frequency module 1F according to the present variation includes: module substrate 100; a first circuit component disposed on first principal surface 101 of module substrate 100; a second circuit component stacked on the first circuit component; and a third circuit component disposed on first principal surface 101 of module substrate 100. The first circuit component includes switch 80 connected between antenna connection terminal 90 and reception filter 61R. The second circuit component includes reception filter 61R and is connected to the first circuit component via side wirings 150 on side surfaces of the first circuit component. The third circuit component includes low-noise amplifier 12 that amplifies a radio frequency reception signal.

As with Embodiment 1, this structure, in which switch 80 and reception filter 61R are stacked, achieves the downsizing of radio frequency module 1F and improves its electrical characteristics, even under a condition that the first, second and third circuit components are disposed on first principal surface 101.

Another Embodiment

The radio frequency module and the communication device according to the present disclosure have been described above, using the embodiments and variations thereof, but the radio frequency module and the communication device according to the present disclosure are not limited to such embodiments and variations thereof. The present disclosure also includes: another embodiment achieved by freely combining structural elements in the embodiments and variations thereof; variations achieved by making various modifications to the embodiments and variations thereof that can be conceived by those skilled in the art without departing from the essence of the present disclosure; and various devices that incorporate the radio frequency module and the communication device described above.

For example, in the radio frequency module and the communication device according to each of the embodiments and variations thereof, another circuit element, wiring, and so forth may be present in a path that connects each circuit element and a signal path disclosed in the drawings. For example, a matching circuit may be connected between duplexer 61 and switch 80, and/or between duplexer 62 and switch 80. Also, for example, a switch may be connected between power amplifier 11 and transmission input terminal 91, and/or between low-noise amplifier 12 and reception output terminal 92. In this case, such switch may be included in semiconductor IC 120 or 120D.

Figure 13:
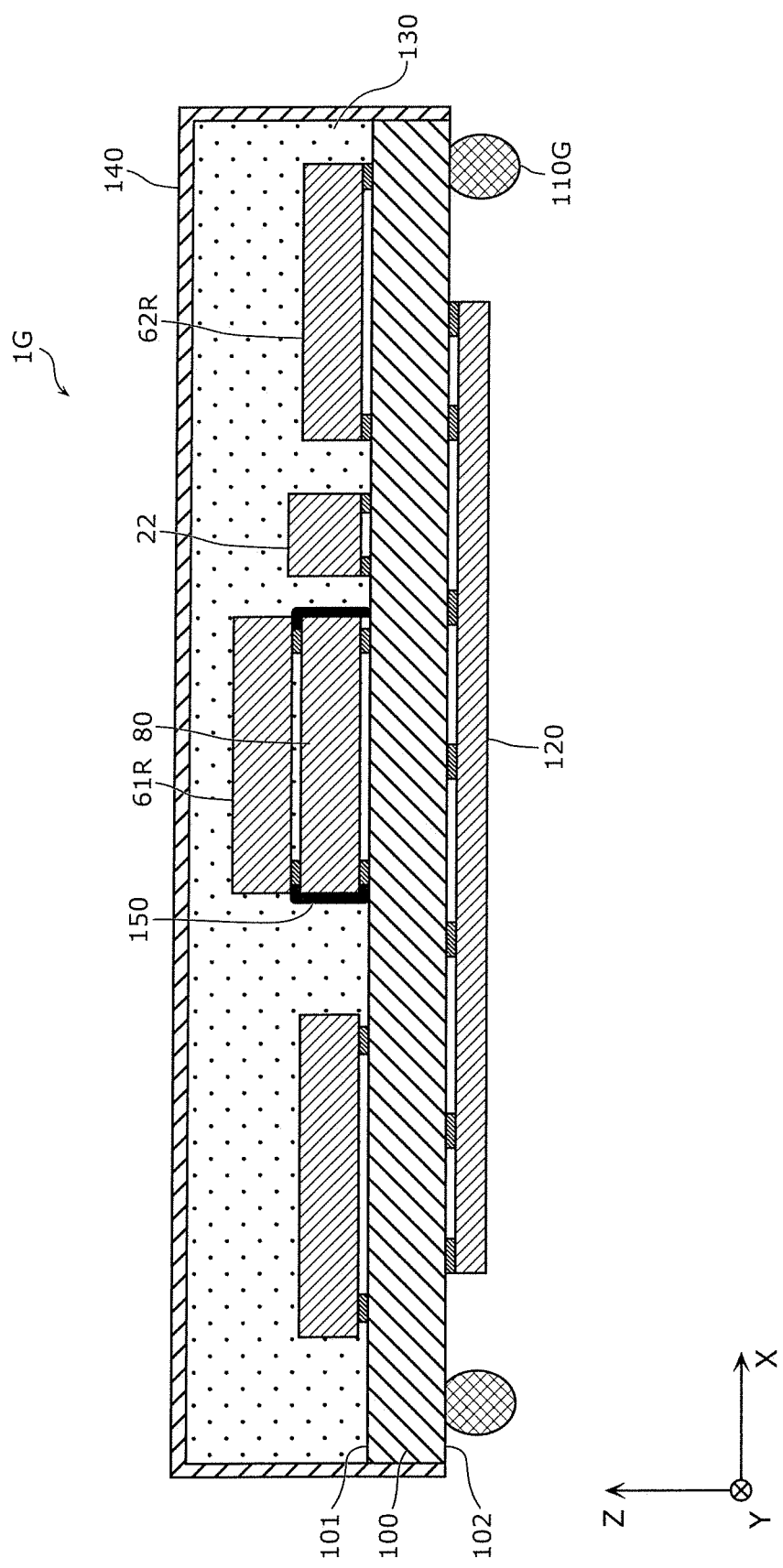
FIG. 13 is a cross-sectional view of a radio frequency module according to another embodiment.

Also, in each of the embodiments and Variations 1 thorough 4, the radio frequency module on which circuit elements are mounted on both surfaces includes post electrodes 110 as its external-connection terminals, but the external-connection terminals are not limited to this example. As shown in FIG. 13, for example, instead of post electrodes 110, radio frequency module 1G may include bump electrodes 110G as its external-connection terminals. In this case, resin member 130 of radio frequency module 1G may not cover second principal surface 102 and semiconductor IC 120.

Also note that the radio frequency module according to each of the embodiments and variations thereof includes a transmission circuit, but may not include a transmission circuit. In this case, the radio frequency module may not include a transmission filter, a power amplifier, and so forth.

Also, in each of the embodiments and variations thereof, at least one switch and one filter are stacked, but the present disclosure is not limited to this example. For example, at least one switch and at least two filters may be stacked. For example, reception filter 61R, transmission filter 61T, and switch 80 may be stacked, and reception filters 61R and 62R, and switch 80 may be stacked.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable for use in a communication device (e.g., mobile phone) as a radio frequency module that is placed at the front-end portion in wireless communication.

The invention claimed is:

1. A radio frequency module, comprising:
a substrate including a first principal surface and a second principal surface opposing the first principal surface;
a first circuit component disposed on the first principal surface;
a second circuit component stacked on the first circuit component; and
a third circuit component disposed on the second principal surface, wherein
one of the first circuit component and the second circuit component includes a first filter,
another of the first circuit component and the second circuit component includes a first switch connected between an antenna connection terminal and the first filter, and
the second circuit component is connected to the first circuit component via a via electrode in the first circuit component or a side wiring on a side surface of the first circuit component.

2. The radio frequency module of claim 1, wherein
the third circuit component includes a low-noise amplifier configured to amplify a radio frequency reception signal.

3. The radio frequency module of claim 2, wherein
the first filter is a reception filter.

4. The radio frequency module of claim 3, wherein
in a plan view of the substrate, at least part of the one of the first circuit component and the second circuit component overlaps at least part of the third circuit component.

5. The radio frequency module of claim 1, further comprising:
a fourth circuit component disposed on the first principal surface.

6. The radio frequency module of claim 5, wherein
the fourth circuit component includes a low-noise amplifier configured to amplify a radio frequency reception signal.

7. The radio frequency module of claim 2, wherein
the other of the first circuit component and the second circuit component includes a second switch connected between the first filter and the low-noise amplifier.

8. The radio frequency module of claim 2, further comprising:
a fourth circuit component disposed on the first principal surface.

9. The radio frequency module of claim 8, wherein
the fourth circuit component includes a second filter.

10. The radio frequency module of claim 9, wherein
the first switch is connected between the antenna connection terminal and the first filter and between the antenna connection terminal and the second filter.

11. The radio frequency module of claim 8, wherein
the third circuit component further includes a second switch connected between the antenna connection terminal and the first switch.

12. The radio frequency module of claim 9, wherein
the first filter has a lower frequency passband than the second filter.

13. The radio frequency module of claim 1, wherein
the second circuit component is connected to the first circuit component via the side wiring.

14. A communication device, comprising:
a signal processing circuit configured to process a radio frequency signal transmitted or received by an antenna; and
a radio frequency module configured to transfer the radio frequency signal between the antenna and the signal processing circuit, wherein
the radio frequency module comprises
a substrate including a first principal surface and a second principal surface opposing the first principal surface;
a first circuit component disposed on the first principal surface;
a second circuit component stacked on the first circuit component; and
a third circuit component disposed on the second principal surface, wherein
one of the first circuit component and the second circuit component includes a first filter,
another of the first circuit component and the second circuit component includes a first switch connected between an antenna connection terminal and the first filter, and
the second circuit component is connected to the first circuit component via a via electrode in the first circuit component or a side wiring on a side surface of the first circuit component.

15. The communication device of claim 14, wherein
the third circuit component includes a low-noise amplifier configured to amplify the radio frequency signal received by the antenna.

16. The communication device of claim 15, wherein
the first filter is a reception filter, and
in a plan view of the substrate, at least part of the one of the first circuit component and the second circuit component overlaps at least part of the third circuit component.

17. The communication device of claim 14, wherein
the radio frequency module further comprises a fourth circuit component disposed on the first principal surface, and
the fourth circuit component includes a low-noise amplifier configured to amplify the radio frequency signal received by the antenna.

18. The communication device of claim 15, wherein
the other of the first circuit component and the second circuit component includes a second switch connected between the first filter and the low-noise amplifier.

19. The communication device of claim 15, wherein
the radio frequency module further comprises a fourth circuit component disposed on the first principal surface,
the fourth circuit component includes a second filter, and
the first switch is connected between the antenna connection terminal and the first filter and between the antenna connection terminal and the second filter.

20. A radio frequency module, comprising:
a substrate including a first principal surface and a second principal surface opposing the first principal surface;
a first circuit component disposed on the first principal surface;

a second circuit component stacked on the first circuit component; and
a third circuit component disposed on the second principal surface, wherein
one of the first circuit component and the second circuit component includes a first filter, and
another of the first circuit component and the second circuit component includes a first switch connected between an antenna connection ten final and the first filter; and
means for connecting the second circuit component to the first circuit component.

\* \* \* \* \*